United States Patent [19]

Morita

[11] Patent Number: 5,382,813
[45] Date of Patent: Jan. 17, 1995

[54] LIGHT EMISSION DIODE COMPRISING A PN JUNCTION OF P-TYPE AND N-TYPE Al-CONTAINING ZNS COMPOUND SEMICONDUCTOR LAYERS

[75] Inventor: Yoshio Morita, Osaka, Japan

[73] Assignee: Matsushita Electric Industrial Co., Ltd., Osaka, Japan

[21] Appl. No.: 149,359

[22] Filed: Nov. 9, 1993

[30] Foreign Application Priority Data

Dec. 17, 1992 [JP] Japan ................... 4-336507

[51] Int. Cl.[6] ............... H01L 29/22; H01L 29/227; H01L 31/0296; H01L 27/14
[52] U.S. Cl. ................... 257/101; 257/13; 257/79; 257/102; 257/103; 257/201; 257/432; 257/442; 257/607; 257/614
[58] Field of Search ............... 257/102, 201, 439, 442, 257/609, 612, 613, 614, 12, 13, 53, 79, 89, 431, 432, 609, 610, 612, 22, 94, 96, 97, 103, 98, 15, 101, 200, 78, 190, 90, 18, 99, 87

[56] References Cited

U.S. PATENT DOCUMENTS

| 5,045,894 | 9/1991 | Migita et al. | 257/15 |
| 5,103,269 | 4/1992 | Tomomura et al. | 257/78 |
| 5,198,690 | 3/1993 | Kitagawa et al. | 257/201 |

FOREIGN PATENT DOCUMENTS 4-72683  3/1992  Japan ................... 257/13

Primary Examiner—Andrew J. James
Assistant Examiner—Alice W. Tang
Attorney, Agent, or Firm—Lowe, Price, LeBlanc & Becker

[57] ABSTRACT

A light emission diode comprises a semiconductor substrate and a pn junction structure including an n-type ZnS compound semiconductor layer and a p-type ZnS compound semiconductor layer, Al being present in at least one of the semiconductor layers. By this, the diode is able to emit blue light at a high luminous intensity.

7 Claims, 1 Drawing Sheet

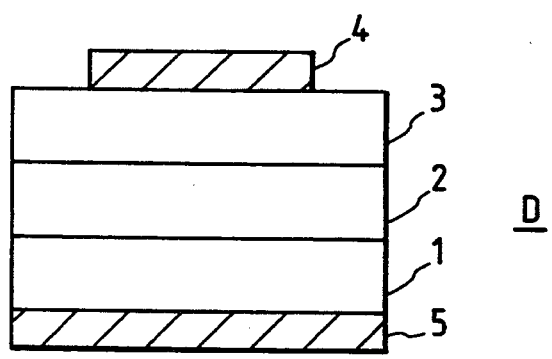

LIGHT EMISSION DIODE COMPRISING A PN JUNCTION OF P-TYPE AND N-TYPE Al-CONTAINING ZNS COMPOUND SEMICONDUCTOR LAYERS

BACKGROUND OF THE INVENTION

1. Field of The Invention

This invention relates to a light emission diode which is capable of emitting light in a wavelength range of blue.

2. Description of The Prior Art

Among light emission diodes which are typical of potential light emitting parts, red light emission diodes using AlGaAs and green light emission diodes using GaP have been in wide use mainly as display devices. From the standpoint of multicoloration and upgrading of function, there is now a strong demand for blue light emission diodes whose luminous intensity is high. For the fabrication of such a blue light emission diode, it will be sufficient to use materials whose forbidden band width is great. In this sense, fabrication of blue light emission diodes has been hitherto proposed including ones which make use of SiC, GaN, and compounds of II-VI groups of the periodic table such as ZnSe, ZnS and the like. However, the diodes using any of these compounds are not satisfactory in practical use with respect to the luminous intensity. For instance, with the ZnS compound which is a compound semiconductor of the II-VI group, blue light emission is based on a deep level. However, the resultant diode involves much of non-luminous transition. Thus, the luminous intensity of the diode is so weak as not to suit for practical use.

SUMMARY OF THE INVENTION

It is accordingly an object of the invention to provide an improved light emission diode which makes use of a ZnS compound promising as a material for blue light emission diodes whereby light in a wavelength range of blue can be emitted at a high luminous intensity.

It is another object of the invention to provide a blue light emission diode which comprises a pn junction structure having a p-type ZnS compound semiconductor and an n-type ZnS compound semiconductor, aluminum being added to both types of semiconductors in defined amounts whereby a high luminous intensity can be attained.

The above objects can be achieved, according to the invention, by a pn Junction-type light emission diode which comprises a semiconductor substrate of one conductivity type, and a ZnS compound semiconductor layer of the one conductivity type, and a ZnS compound semiconductor layer of the other conductivity type formed on the semiconductor substrate in this order, the improvement characterized in that aluminum is present in at least one of the semiconductor layers in an amount sufficient to maintain a zincblende crystal structure of tile ZnS compound in the at least one layer. More particularly, the Al element may be present in the ZnS semiconductor layer of the one conductivity type or the ZnS semiconductor layer of the other conductivity type or also in both layers. Preferably, the Al element is present in both layers.

We have made extensive studies on ZnS compound semiconductors to which a variety of elements are added in different amounts including an alloy component level. The resultant mixtures have been subjected to measurement of a luminous intensity. As a result, it has been found that if Al is contained in the ZnS compound in an amount not to change the zincblende crystal structure thereof, the blue light emission intensity or luminous intensity is significantly increased over the case where no Al element is added. In addition, when Al is added, the ZnS compound semiconductor can be conveniently controlled with respect to the n-type and p-type conductivities. Especially, when N is doped as a p-type impurity and Cl is doped as an n-type impurity, good optical and electric characteristics are obtained. Thus, it becomes possible to fabricate a pn junction type light emission diode. More particularly, the luminous intensity in the photoluminescence of the diode using the Al-containing ZnS compound is brighter by 10 times or over than a light emission diode using an undoped ZnS compound.

When N is used as a p-type impurity, doping with a carrier concentration of approximately $10^{19}$ cm$^{-3}$ is possible. This is true of the case using Cl as an n-type impurity. This enables one to obtain a pn junction-type light emission diode by use of these p-type and n-type ZnS compound semiconductors. The light emission wavelength is as broad as 400 to 550 nm. Using the pn junction-type blue light emission diode, multicoloration and upgrading of function of light emission diodes become possible. This contributes to a significant improvement in performance of display devices and information processing devices.

BRIEF DESCRIPTION OF THE DRAWING

The sole FIGURE is a schematic sectional view of a light emission diode according to an embodiment of the invention.

PREFERRED EMBODIMENTS OF THE INVENTION

Reference is now made to the sole FIGURE

The FIGURE shows a light emission diode D which includes a semiconductor substrate 1 of one conductivity type, and a ZnS compound semiconductor layer of the same conductivity type as the substrate 1, and a ZnS compound semiconductor layer 3 of the other conductivity type formed on the substrate 1 in this order as shown. Reference numerals 4, 5, respectively, indicate electrodes of the other conductivity type and the one conductivity type.

The semiconductor substrate 1 may be made of semiconductors such as GaAs, GaP, and the like. The n-type or p-type conductivity may be imparted by any known procedure, e.g. if GaAs is used, GaAs may be doped with Si, S or the like for the n-type conductivity and with Zn, Cd or the like for the p-type conductivity.

On the semiconductor substrate 1 is formed the ZnS compound semiconductor layer 2 in which Al may be present in an amount sufficient to keep the zincblende crystal structure of the ZnS compound and to effectively enhance the luminous intensity of the resultant diode. If present, the amount of Al is preferably in the range of from 1 to 10 wt % more preferably from 3 to 7 wt % of the total of the ZnS and Al. This is because when the amount exceeds 10 wt %, the zincblende crystal structure may be broken. On the other hand, when the amount is less than 1 wt %, the luminous intensity undesirably becomes weak. If the substrate 1 is of the n-type conductivity, the layer 2 should also be of the n-type conductivity. On the contrary, when the substrate 1 is of the p-type conductivity, the layer 2 should be of the p-type conductivity as well.

For impartment of the n-type conductivity, halogens such as Cl, I and the like or Ga is doped to the layer 2 at a level of not lower than $10^{17}/cm^3$. Likewise, for the p-type conductivity, N, P, Li or the like is doped at the same doping level as defined above. Preferably, Cl and N are, respectively, used for the n-type and p-type conductivities imparted to the layers 2 and 3. This is because Cl and N can be both doped in larger amounts in the order of $10^{19}/cm^3$.

The diode D has the ZnS semiconductor layer 3 formed on the layer 2. The layer 3 should be of the conductivity type other than the one conductivity type of the layer 2, thereby making a pn junction. In this layer 3, Al should be present in an amount as defined with respect to the layer 2 of the layer 2 is free of Al. That is, the amount is preferably in the range of from 1 to 10 wt %, more preferably from 3 to 7 wt %, of the total of ZnS and Al in the layer 3. As a matter of course, a desired conductivity may be imparted to the layer 3 by doping an impurity as set out with respect to the layer 2. As stated hereinbefore, Al should be contained in the defined amount in either or both of the layers 2, 3. Preferably, Al is in both layers.

The diode D has an electrode 5 on one side of the substrate 1 which is opposite to a side where the layer 2 has been formed. The electrode 5 should have the same conductivity as the substrate 1. Another electrode 4 is formed on the ZnS compound semiconductor layer 3 with the same conductivity type as the layer 3. The electrodes 4, 5 may be made, for example, Au—Ge, Au—Ge—Ni, Ti—Pt or the like for the n-type conductivity and In—Ga, Au—Mn, Cr—Au and the like for the p-type conductivity.

The diode D may be fabricated by known methods such as an MOVPE (metalorganic vapor phase epitaxy) method, an MBE (molecular beam epitaxy) method or the like without resorting to any other specific techniques except that aluminum is added to the layers 2, 3 during the formation of the layers 2, 3. For instance, Zn, S and Al sources are subjected to the MBE method or MOVPE method under conditions which are known in the art and may differ depending on the types of starting sources and the method. With the MOVPE method, the substrate temperature is usually in the range of from 300° to 500° C. Likewise, with the MBE method, the substrate temperature is generally in the range of from 200° to 400° C.

The layers 2, 3 are each generally formed in a thickness of from 0.5 to 2 μm.

According to a more specific and preferred embodiment of the invention, a light emission diode comprises a GaAs substrate of one conductivity type, a ZnS compound semiconductor layer of an n-type conductivity which contains 1 to 10 wt % of Al and is doped with Cl, and a ZnS compound semiconductor layer of a p-type conductivity type which contains 1 to 10 wt % of Al and is doped with N wherein one of the semiconductor layers is formed directly on the substrate so as to make the coincidence in the conductivity between the directly formed layer and the substrate.

The present invention is described in more detail by way of examples.

EXAMPLE 1

In this example, a light emission diode was made according to the MOVPE method. First, an n-type GaAs substrate was provided and heated to a temperature of 350° C. DMZn (dimethyl zinc), H$_2$S and TMAl (trimethyl aluminium) were used as source materials and were subjected to the MOVPE method under conditions of transport rates of 10μ mols/minute, 60μ mols/minute and 100μ mols/minute for DMZn, H$_2$S and TMAl, respectively, to permit a 1 μm thick, 5% Al-containing ZnS compound semiconductor layer to grow on the substrate. During the course of the growth, the layer was doped with C$_2$H$_5$I in an amount of $10^{18}/cm^3$, thereby imparting the n-type conductivity to the layer. Under the same conditions as set out above except that PH$_3$ was used instead of C$_2$H$_5$I for doping in an amount of $10^{18}/cm^3$, a 1 μm thick, 5% Al-containing ZnS compound semiconductor layer of a p-type conductivity was formed on tile n-type semiconductor layer. The n-type and p-type semiconductor layers had a forbidden band width of 3.7 eV. Thereafter, a p-type In—Ga electrode and an n-type Au—Ge electrode were, respectively, formed on the p-type compound semiconductor layer and the n-type substrate, thereby obtaining a light emission diode as shown in the sole FIGURE.

The thus obtained diode was passed with an electric current to assess a current-voltage characteristic, revealing that the diode was capable of emitting blue light with a luminous intensity of 300 mcd and a center wavelength of 40 nm on application of a forward current of 40 mA.

EXAMPLE 2

In this example, a light emission diode was made according to the MBE method. First, an n-type GaAs substrate was provided and heated to a temperature of 260° C. Zn, Al and S were used as source materials and were subjected to the MBE method using K cells under conditions of beam pressures of $1\times10^{-5}$ Torr, $1\times10^{-7}$ Torr and $5\times10^{-5}$ Torr, respectively, with a background pressure of $10^{-9}$ Torr to permit a 1 μm thick, 5% Al-containing ZnS compound semiconductor layer of an n-type conductivity to grow on the substrate. During the course of the growth, the layer was doped with ZnCl$_2$ in an amount of $10^{19}/cm^3$, thereby imparting the n-type conductivity to the layer. Under the same conditions as set out above except that the source for ZnCl$_2$ was closed, a 1 μm thick, 5% Al-containing ZnS compound semiconductor layer of the p-type conductivity was formed on the n-type semiconductor layer while doping with radical N excited with a high frequency plasma. The amount of the doping reached $10^{19}/cm^{-3}$. The n-type and p-type semiconductor layers had a forbidden band width of 3.7 eV. Thereafter, a p-type In—Ga electrode and an n-type Au—Ge electrode were, respectively, formed on the p-type semiconductor layer and the n-type substrate, thereby obtaining a light emission diode.

The thus obtained diode was passed with an electric current to assess a current-voltage characteristic, revealing that the diode was capable of emitting blue light with a luminous intensity of 500 mcd and a center wavelength of 470 nm on application of a forward current of 40 mA. The diode was stable over a long time at the operating current of 40 mA.

EXAMPLE 3

The general procedure of Example 2 was repeated except that Al was added to the n-type ZnS compound semiconductor layer alone, thereby obtaining a light emission diode.

The diode was capable of emitting blue light with a luminous intensity of 300 mcd and a center wavelength of 470 on application of a forward current of 40 mA.

As will be apparent from the above examples, the diodes of the invention exhibit a very high luminous intensity, and N and Cl are very effective for use as p-type dopant and n-type dopant, respectively.

Similar results are obtained when using a p-type GaAs substrate on which p-type and n-type Al-containing ZnS compound semiconductor layers are formed in this order.

What is claimed is:

1. A pn junction-type light emission diode which comprises a semiconductor substrate of one conductivity type, and a ZnS compound semiconductor layer of the one conductivity type and a ZnS compound semiconductor layer of the other conductivity type formed on the semiconductor substrate in this order, at least one of the semiconductor layers containing aluminum in an amount ranging from 1 to 10 wt % of the total of ZnS and Al whereby the ZnS compound has a zincblende crystal structure in the at least one layer.

2. The light emission diode according to claim 1, wherein the amount is in the range of from 3 to 7 wt %.

3. The light emission diode according to claim 1, wherein said aluminum is present in one of the semiconductor layers.

4. The light emission diode according to claim 1, wherein said aluminum is present in both semiconductor layers.

5. The light emission diode according to claim 1, wherein the ZnS compound semiconductor layer of the one conductivity type is an n-type ZnS compound semiconductor layer doped with Cl and the ZnS compound semiconductor layer of the other conductivity type is a p-type ZnS compound semiconductor layer doped with N.

6. The light emission diode according to claim 1, further comprising an electrode of the one conductivity type formed on one side of said substrate which is opposite to a side of said substrate having thereon the ZnS compound semiconductor layer of the one conductivity type and an electrode of the other conductivity type formed on the ZnS compound semiconductor layer of the other conductivity type.

7. A pn junction-type light emission diode which comprises a GaAS substrate of one conductivity type, a ZnS compound semiconductor layer of an n-type conductivity type which contains 1 to 10 wt % of Al and is doped with Cl, and a ZnS compound semiconductor layer of a p-type conductivity type which contains 1 to 10 wt % of Al and is doped with N wherein one of the semiconductor layers is formed directly on the substrate so that the substrate and the directly formed layer exhibit the same conductivity type.

* * * * *